US008467755B2

(12) United States Patent
Olson

(10) Patent No.: US 8,467,755 B2
(45) Date of Patent: Jun. 18, 2013

(54) DIRECT CONVERSION TUNER

(75) Inventor: Erlend Olson, Duarte, CA (US)

(73) Assignee: Broadcom Corporation, Irvine, CA (US)

( * ) Notice: Subject to any disclaimer, the term of this patent is extended or adjusted under 35 U.S.C. 154(b) by 551 days.

(21) Appl. No.: 12/654,196

(22) Filed: Dec. 14, 2009

(65) Prior Publication Data

US 2010/0093295 A1    Apr. 15, 2010

Related U.S. Application Data

(63) Continuation of application No. 11/410,008, filed on Apr. 25, 2006, now Pat. No. 7,636,558, which is a continuation of application No. 09/665,581, filed on Sep. 18, 2000, now Pat. No. 7,050,778.

(51) Int. Cl.
*H04B 17/00* (2006.01)
*H04B 1/10* (2006.01)

(52) U.S. Cl.
USPC ............... 455/226.1; 455/67.14; 455/302; 455/305

(58) Field of Classification Search
USPC .......... 455/323, 326, 285, 302, 305, 226.1, 455/67.11, 67.14, 296, 311
See application file for complete search history.

(56) References Cited

U.S. PATENT DOCUMENTS

| 3,070,747 A | 12/1962 | Addleman |
| 3,641,515 A | 2/1972 | Sues |
| 3,681,697 A | 8/1972 | Moroney |
| 4,006,420 A | 2/1977 | Schittko |
| 4,031,469 A | 6/1977 | Johnson |
| 4,138,645 A | 2/1979 | Parato |
| 4,340,975 A | 7/1982 | Onishi et al. |
| 4,368,468 A | 1/1983 | Lisle et al. |
| 4,696,055 A | 9/1987 | Marshall |
| 4,858,159 A | 8/1989 | Wheelwright et al. |

(Continued)

FOREIGN PATENT DOCUMENTS

| EP | 0208470 A2 | 1/1987 |
| EP | 0473373 A2 | 3/1992 |

(Continued)

OTHER PUBLICATIONS

Rudell et al, "A 1.9-Ghz Wide Band IF Double conversion CMOS Receiver for Cordless Telephone Applications", IEEE Journal of Solid-state circuits, vol. 32, No. 12, Dec. 1997, pp. 2071-2088.*

(Continued)

*Primary Examiner* — Duc M Nguyen
(74) *Attorney, Agent, or Firm* — Sterne, Kessler, Goldstein & Fox P.L.L.C.

(57) ABSTRACT

A direct conversion tuner down-converts television signals, cable signals, or other signals directly from an RF frequency to an IF frequency and/or baseband, without an intermediate up-conversion step for image rejection. The direct conversion tuner includes a pre-select filter, an amplifier, an image reject mixer, and a poly-phase filter. The pre-select filter, amplifier, and the image reject mixer can be calibrated to provide sufficient image rejection to meet the NTSC requirements for TV signals. The entire direct conversion tuner can be fabricated on a single semiconductor substrate without requiring any off-chip components. The tuner configuration described herein is not limited to processing TV signals, and can be utilized to down-convert other RF signals to an IF frequency or baseband.

18 Claims, 19 Drawing Sheets

U.S. PATENT DOCUMENTS

| | | | |
|---|---|---|---|
| 5,200,826 A | | 4/1993 | Seong |
| 5,265,267 A | * | 11/1993 | Martin et al. .................. 455/326 |
| 5,329,319 A | | 7/1994 | Sgrignoli |
| 5,337,014 A | | 8/1994 | Najle et al. |
| 5,390,348 A | | 2/1995 | Magin et al. |
| 5,408,196 A | | 4/1995 | Sempel et al. |
| 5,493,710 A | | 2/1996 | Takahara et al. |
| 5,513,029 A | | 4/1996 | Roberts |
| 5,584,068 A | | 12/1996 | Nohindra |
| 5,585,842 A | | 12/1996 | Chappell et al. |
| 5,692,279 A | | 12/1997 | Mang et al. |
| 5,737,035 A | | 4/1998 | Rotzoll |
| 5,822,687 A | | 10/1998 | Bickley et al. |
| 5,847,612 A | | 12/1998 | Birleson |
| 5,898,912 A | | 4/1999 | Heck |
| 5,930,696 A | | 7/1999 | Tzuang et al. |
| 5,950,119 A | | 9/1999 | McGeehan et al. |
| 5,963,856 A | | 10/1999 | Kim |
| 6,009,317 A | | 12/1999 | Wynn |
| 6,011,962 A | | 1/2000 | Lindenmeier et al. |
| 6,028,647 A | | 2/2000 | Fukai et al. |
| 6,035,186 A | * | 3/2000 | Moore et al. .................. 455/313 |
| 6,037,999 A | | 3/2000 | Kunishima |
| 6,081,700 A | | 6/2000 | Salvi et al. |
| 6,118,322 A | | 9/2000 | Bockelman et al. |
| 6,160,572 A | | 12/2000 | Matsuura |
| 6,163,684 A | | 12/2000 | Birleson |
| 6,169,569 B1 | | 1/2001 | Widmer et al. |
| 6,233,442 B1 | | 5/2001 | Koda et al. |
| 6,240,100 B1 | | 5/2001 | Riordan et al. |
| 6,330,290 B1 | | 12/2001 | Glas |
| 6,377,620 B1 | | 4/2002 | Ozluturk et al. |
| 6,427,068 B1 | | 7/2002 | Suominen |
| 6,484,042 B1 | | 11/2002 | Loke |
| 6,603,810 B1 | | 8/2003 | Bednekoff et al. |
| 6,639,951 B1 | | 10/2003 | Katoh et al. |
| 6,694,131 B1 | * | 2/2004 | Lakkis .......................... 455/302 |
| 6,714,776 B1 | | 3/2004 | Birleson |
| 6,895,229 B2 | | 5/2005 | Schetelig et al. |
| 6,952,564 B2 | | 10/2005 | Gannholm |
| 7,050,778 B1 | | 5/2006 | Olson |
| 7,054,610 B1 | | 5/2006 | Itoh et al. |

FOREIGN PATENT DOCUMENTS

| | | |
|---|---|---|
| EP | 0576082 A1 | 12/1993 |
| EP | 0883237 A1 | 12/1998 |
| WO | WO 99/16179 | 4/1999 |

OTHER PUBLICATIONS

International Search Report issued Apr. 10, 2002 for PCT/US01/29027, 7 pages.

Ducourant et al, "A 3 Chip G&As Double Conversion TV Tuner System With 70 dB Image Rejection," *IEEE 1989 Microwave and Millimeter-Wave Monolithic Circuits Symposium*, pp. 87-90.

Farmer, "Specifications for Tuner Design for Use in Cable Ready Television Receivers and VCRs," *IEEE Transactions on Consumer Electronics*, vol. 36, No. 3, Aug. 1990, pp. 660-668.

Maas, "Microwave Mixers," Artech House, Copyright, 1986, pp. 248-251.

* cited by examiner

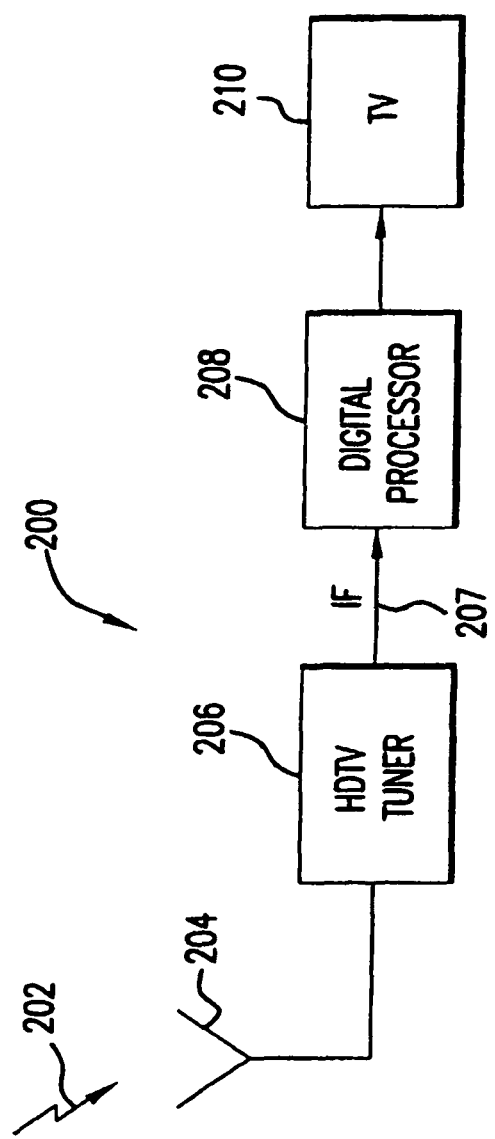

| CHANNEL | CHANNEL FREQUENCY (MHz) | LO FREQUENCY (MHz) | IF FREQUENCY (MHz) |
|---|---|---|---|
| 2 | 57 | 93 OR 21 | 36 |
| 3 | 63 | 99 OR 27 | 36 |
| 3 | 69 | 105 OR 33 | 36 |
| 4 | 75 | 111 OR 39 | 36 |
| . | . | . | . |
| . | . | . | . |
| . | . | . | . |
| 134 | 848 | 884 OR 812 | 36 |
| 135 | 854 | 890 OR 818 | 36 |
| 136 | 860 | 896 OR 824 | 36 |

FIG.10A

DIRECT CONVERSION TUNER

This application is a continuation of U.S. patent application Ser. No. 11/410,008, filed Apr. 25, 2006, which application is a continuation of U.S. patent application Ser. No. 09/665,581, filed Sep. 18, 2000, both of which are incorporated herein by reference in their entirety.

BACKGROUND OF THE INVENTION

1. Field of the Invention

The present invention generally relates to television tuner circuits, and more specifically to a direct conversion television tuner for processing broadcast, cable, and satellite television signals.

2. Related Art

Television signals are transmitted at radio frequencies (RF) using terrestrial, cable, or satellite transmission schemes. Terrestrial and cable TV signals are typically transmitted at frequencies of approximately 57 to 860 MHZ, with 6 MHZ channel spacings. Satellite TV signals are typically transmitted at frequencies of approximately 980 to 2180 MHz.

Regardless of the transmission scheme, a tuner is utilized to down-convert the received RF signal to an intermediate frequency (IF) signal or a baseband signal, which is suitable for processing and display on a TV or computer screen. The tuner should provide sufficient image rejection during down-conversion as is necessary for the specific application. The National Television Standards Committee (NTSC) sets standards for television signal transmission, reception, and display. To process a NTSC signal, it is preferable that the tuner have a high-level of image rejection. However, less image rejection is acceptable depending on the specific application and the corresponding display requirements.

To achieve a high level of image rejection, traditional TV tuners utilize a dual-conversion architecture having two mixers and a surface acoustic wave (SAW) filter. The first mixer up-converts the received RF signal to a first IF frequency (e.g. 1200 MHZ) that is fixed above the RF signal band, using a variable local oscillator (LO) signal. A SAW filter, centered at the first IF, selects the channel of interest and provides the necessary image rejection to prevent signal interference. The second mixer then down-converts the first IF to a lower frequency second IF, using a second fixed frequency LO signal. The second IF output is at baseband for a NTSC compatible signal. Alternatively, the second IF is at 36 or 44 MHZ for a cable system output that is fed into a set-top box or a cable modem. Channel selection is realized by adjusting the first LO signal so that the desired down-converted channel(s) falls in the narrow passband of the SAW filter. The remaining channels are rejected by the SAW filter.

Due to advances in silicon integrated circuit (IC) technology, most of the tuner components (i.e. mixers, local oscillators, etc.) can be fabricated on a single silicon IC, with the exception of the SAW filter. The SAW filter is a mechanically resonant device that is typically fabricated on a ceramic substrate, and therefore cannot be integrated on-chip with the other tuner components. As such, the SAW device remains a discrete component in the TV tuner design, which prevents the TV tuner from being fabricated on a single silicon substrate.

A single chip solution is highly desirable for TV tuners and cable modems. The single chip solution will reduce or eliminate component adjustment during manufacturing, and therefore lead to a reduction in manufacturing time and cost. The single chip solution will likely improve electrical performance of the tuner because there are parasitics associated with driving a signal off-chip for processing. Additionally, the single chip solution will reduce the size of the tuners, which becomes more critical for non-TV set applications. Therefore, what is required is a TV tuner architecture that can be implemented on a single semiconductor substrate.

Furthermore, a TV tuner with low power requirements is also desired. Cable TV operators plan to offer voice telephone service and/or Internet access to their customers over currently installed cable lines. The telephone traffic will be transmitted over the cable lines at RF frequencies, along with the TV programming. As such, the TV tuner will likely be utilized to down-convert the telephone traffic to baseband for user consumption. In the current POTS (plain old telephone service) system, government regulations require that the phone companies supply sufficient power over telephone lines to operate the customer's telephone. This allows the customer to utilize the telephone during a power outage, to call the electric company for example. If a similar requirement were placed on voice-over-cable service, then the cable company would have to supply enough power over the cable lines to operate the TV tuner.

The conventional dual conversion tuner architecture requires a few watts of power for operation, which is a relatively high power requirement. The high power drain occurs because the dual conversion scheme requires two mixers that are driven by two local oscillators operating at RF frequencies. If voice-over-cable is to be realizable, then the tuner power requirements should be reduced to approximately 0.5 watt of power dissipation.

Therefore, what is needed is a tuner architecture that has good electrical characteristics (e.g. high image rejection, and good linearity), low power requirements, and which can be implemented on a single semiconductor substrate.

SUMMARY OF THE INVENTION

The present invention is directed to a direct conversion television tuner for processing television or cable signals. The direct conversion television tuner down-converts a selected channel directly from an RF frequency to an IF frequency and/or baseband, without performing an intermediate up-conversion frequency translation as in conventional tuners.

The direct conversion TV tuner includes a pre-select filter, an amplifier, an image reject mixer, and an IF filter. The pre-select filter receives an RF signal having multiple TV channels. The image reject mixer down-converts a selected channel to an IF frequency that is within the passband of the IF filter. Channel selection is performed by tuning the frequency of a local oscillator signal that drives the image reject mixer, and thereby tuning the channel that is translated into the passband of the IF filter. The frequency of the IF output signal is flexible, and can be set so it is compatible with conventional set-top box and cable modem applications. Additionally, the IF output signal can be converted to a digital format using an A/D converter. In embodiments, the IF output signal is further processed to generate a NTSC compatible signal that can directly drive a television set without any further processing.

In embodiments, the pre-select filter, amplifier, and the image reject mixer are individually calibrated to improve image rejection at the selected channel frequency. The calibration is performed by injecting a test signal into the tuner input, where the frequency of the test signal is at the selected channel frequency. After which, the I/Q balance of the pre-filter is separately determined based on the test signal, bypassing the effects of the amplifier and the image reject mixer. Any I/Q imbalance in the pre-select filter is corrected by adjusting filter parameters. Once the filter is calibrated, the I/Q balance of the amplifier is determined based on the test signal input, bypassing the effects of the image reject mixer. Any I/Q imbalance in the amplifier is corrected by adjusting the amplifier parameters. Once the amplifier is calibrated, the I/Q balance of the image reject mixer is determined based on the test signal input. Any I/Q imbalance in the image reject mixer is corrected by adjusting parameters of the image reject mixer, and/or by adjusting the I/Q balance of the local oscillator that drives the image reject mixer.

The calibration procedure can be repeated for each new channel selection to compensate for I/Q imbalances that vary over frequency. Additionally, the calibration procedure can be repeated for the same channel after a defined time delay to compensate for temperature effects or other miscellaneous time sensitive effects. The result of the calibration procedure is that tuner image rejection preferably meets or exceeds corresponding requirements over the input frequency band of interest.

An advantage of the present invention is that the direct conversion tuner has a single conversion architecture. More specifically, the selected TV channel is directly down-converted to an IF frequency in a single frequency translation by the image reject mixer. In contrast, conventional tuners have a dual conversion architecture, which performs two frequency translations (one up-conversion and one down-conversion), along with off-chip filtering. The direct conversion tuner has lower power requirements because the single frequency conversion only requires one high frequency local oscillator and one mixer, compared with two of each for the conventional dual conversion tuner.

Additionally, the direct conversion tuner can be fabricated on a single semiconductor substrate, which does not require any off-chip filtering. This is possible because the calibrated image reject mixer provides high image rejection, without using an off-chip SAW filter. As a result, the direct conversion tuner enables a single-chip solution for TV tuner and cable modem applications.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

FIG. 2 illustrates a terrestrial digital TV environment;

FIG. 10A illustrates a table of LO frequencies associated with a 36 MHZ IF produced by single step down-conversion, according to embodiments of the invention;

DETAILED DESCRIPTION OF THE EMBODIMENTS

1. Terrestrial, Cable, and TV Satellite Services

Television signals are transmitted at radio frequencies (RF) using terrestrial, cable, or satellite transmission schemes. Terrestrial and cable TV signals are typically transmitted at frequencies of approximately 57 to 860 MHZ, with 6 MHZ channel spacings. Satellite TV signals are typically transmitted at frequencies of approximately 980 to 2180 MHz. Regardless of the transmission scheme, a tuner is utilized to down-convert the received RF signal to an IF signal or a baseband signal, which is suitable for processing and display on a TV or computer screen. The desired tuner output can vary depending on the specific transmission scheme, as described below.

Terrestrial TV service is transmitted over the air from ground-based (as opposed to satellite-based) antennas. Terrestrial TV service can be subdivided into conventional analog TV and digital TV (including DTV and HDTV).

Figure 1A:
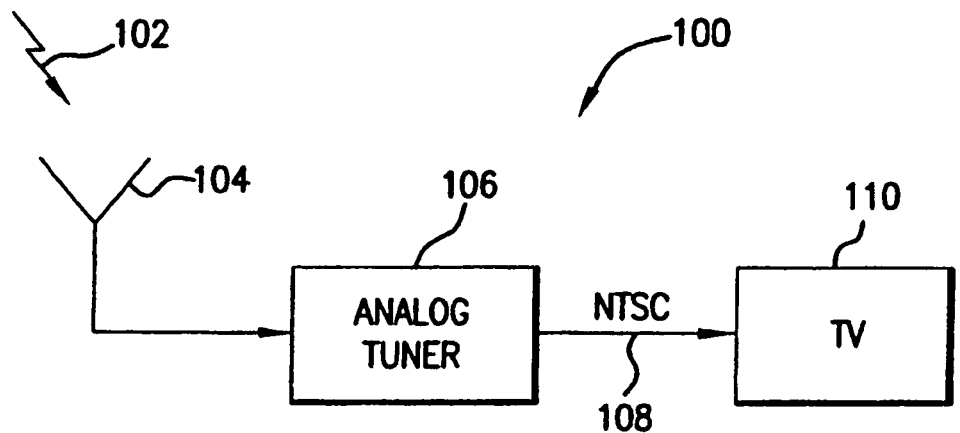
FIG. 1A illustrates a terrestrial analog TV environment.
Figure 1B:
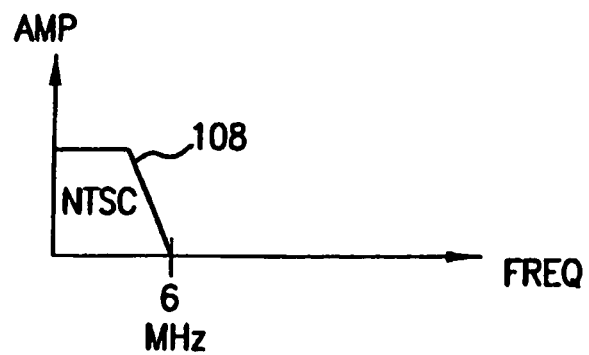
FIG. 1B illustrates a frequency spectrum of a NTSC baseband signal.

FIG. 1A illustrates a conventional analog TV environment 100 having a TV tuner 106 that receives an RF TV signal 102 from an antenna 104. RF TV signal 102 carriers conventional analog TV programming. The analog tuner 106 down-converts the TV signal 102 to a NTSC compatible signal 108. NTSC stands for National Television Standards Committee, and the NTSC standard specifies the parameters for a baseband TV video/audio signal that drives a conventional raster TV monitor. As such, the NTSC baseband signal 108 can be directly coupled to the TV monitor 110. FIG. 1B illustrate the frequency spectrum of a NTSC signal 108. As shown, the NTSC signal 108 has a frequency spectrum at baseband with a 6 MHZ bandwidth.

FIG. 2 illustrates a digital TV environment 200 having an antenna 204, a tuner 206, a digital processor 208, and a TV monitor 210. The antenna 204 receives a digital TV signal 202, which can be a high definition TV signal (HDTV), for example. The tuner 206 down-converts the signal 202 to an intermediate frequency (IF) signal 207. The processor 208 further processes the IF signal 207, for display on the TV monitor 210. In embodiments, the processor 208 converts the IF signal 207 to a NTSC compatible signal to drive the TV monitor 210.

Cable TV service is carried to the customer using coaxial cables (or the equivalent), where the cables are typically buried underground. Traditional cable TV carries analog TV programming. Modern cable TV service can include digital cable TV, Internet access, and even telephone service. The telephone service is typically provided using a packet-based communications protocol, such as Internet protocol (IP).

Figure 3A:
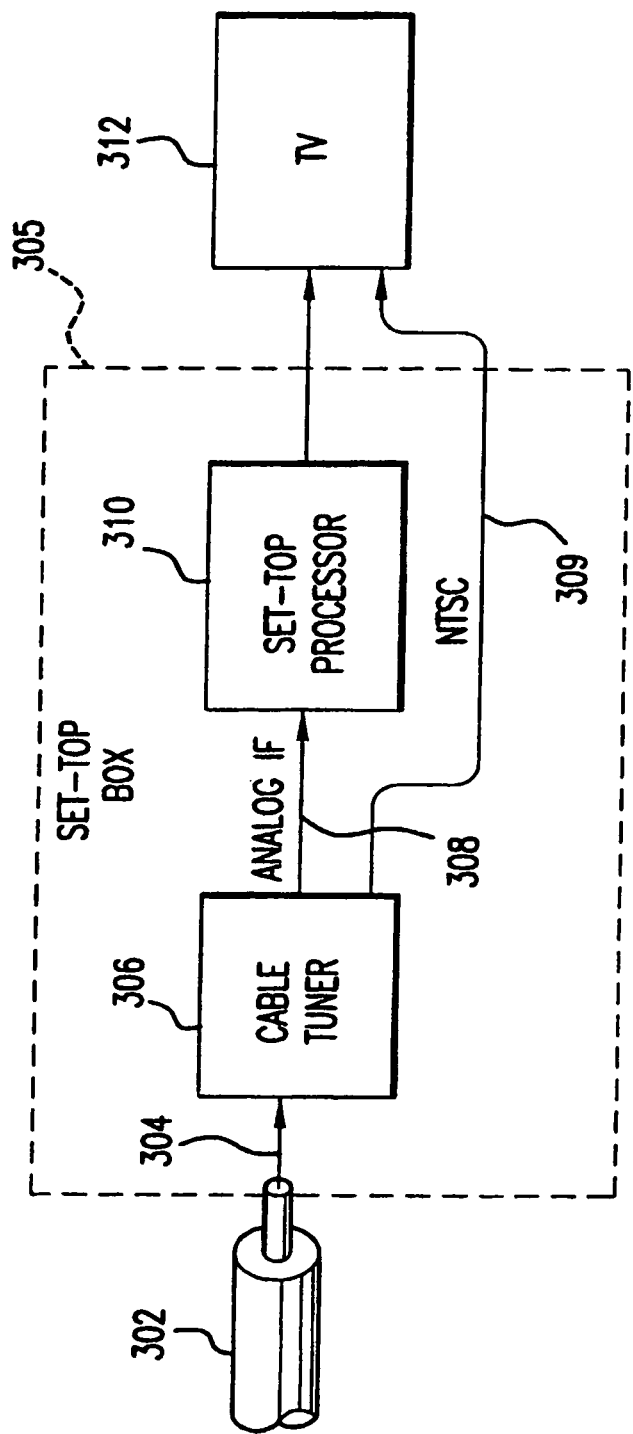
FIG. 3A illustrates an analog cable TV environment.

FIG. 3A illustrates an analog cable TV environment 300 including a cable 302, a set top box 305 having a tuner 306 and a set-top box processor 310, and a TV monitor 312. The cable 302 carries a cable signal 304 having analog cable TV programming. The tuner 306 down-converts the cable signal 304 to produce an analog IF signal 308 carrying analog TV signals, and a NTSC signal 309. The NTSC signal 309 exists at baseband and can be routed directly to the TV monitor 312 as described above. The analog IF signal 308 carries additional TV features (e.g. on-screen program information) that are not carried by the NTSC signal 309. The analog IF signal 308 is sent to the set-top processor 310 for further processing in order to generate a signal suitable to drive the TV monitor 312.

Figure 3B:
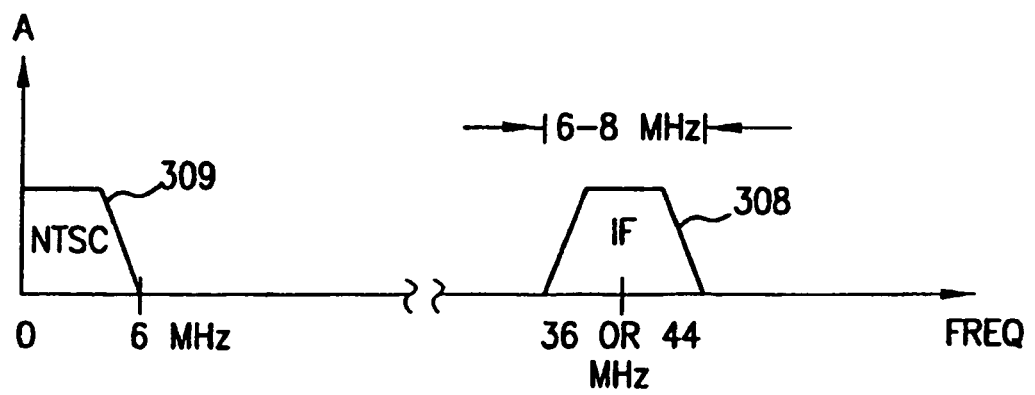
FIG. 3B illustrates the frequency spectrum of an analog IF signal compared to the frequency spectrum of a NTSC signal.

For comparison purposes, FIG. 3B illustrates the frequency spectrum of the analog IF signal 308 and the NTSC signal 309. As described above, the NTSC signal has a 6 MHZ bandwidth at baseband. The analog IF signal 308 has a 6-8 MHZ bandwidth at 36 MHZ, or 44 MHZ, or some other useful IF frequency. In other words, the IF frequency of the signal 308 can be selected so as to be compatible with the processor 310. In embodiments, the IF signal 308 is modulated according to quadrature amplitude modulation (QAM), which is a multi-level multibit signal format that is well known to those skilled in the arts.

Figure 4:
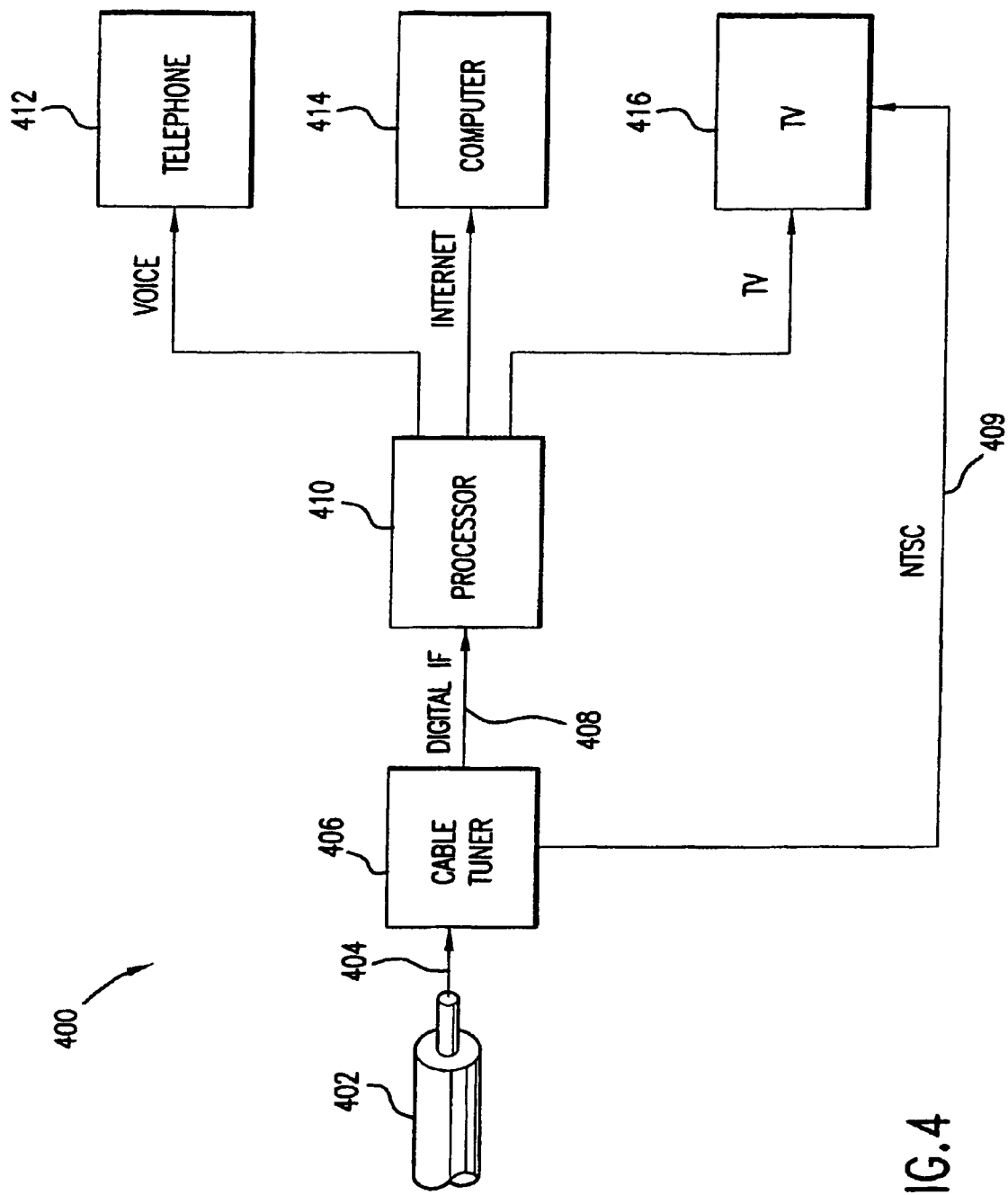
FIG. 4 illustrates a digital cable TV environment having telephone service and Internet access.

FIG. 4 illustrates a digital cable TV environment 400 having a cable 402, a tuner 406, a processor 410, a telephone 412, a computer 414, and a TV monitor 416. The cable 402 carries a cable signal 404 that includes one or more of the following: digital cable TV signals, Internet access, and telephone traffic. The tuner 406 down-converts the cable signal 404 to produce an IF signal 408 carrying digital data, and a NTSC signal 409. The NTSC signal 409 can be sent directly to the TV monitor 416 for display as described above. The digital IF signal 408 carries the digital cable TV, Internet access, and telephone traffic. In embodiments, the digital IF signal 408 is a QAM signal having a bandwidth of 6-8 MHZ and existing at 36 MHZ or 44 MHZ, and having a frequency spectrum that is similar to the frequency spectrum of the analog IF signal 308 (in FIG. 3B).

Still referring to FIG. 4, a processor 410 separates the content of the digital IF signal 408, and provides any necessary post-down-conversion processing. After processing, telephone traffic is sent to the telephone 412, Internet traffic is sent to the computer 414, and TV programming in sent to the TV monitor 416. The digital cable TV signals may be converted to the NTSC format prior to display.

The processor 410 is meant to be a functional representation and is not meant to be limiting. In other words, the processor 410 can include one or more distinct processors to separately process the voice, Internet, and TV programming signals, as per the specific application and signal protocols. When the cable signal 404 is providing Internet access, then the tuner 406 and processor 410 are often referred to as being part of a cable modem, as will be understood by those skilled in the arts.

Figure 5:
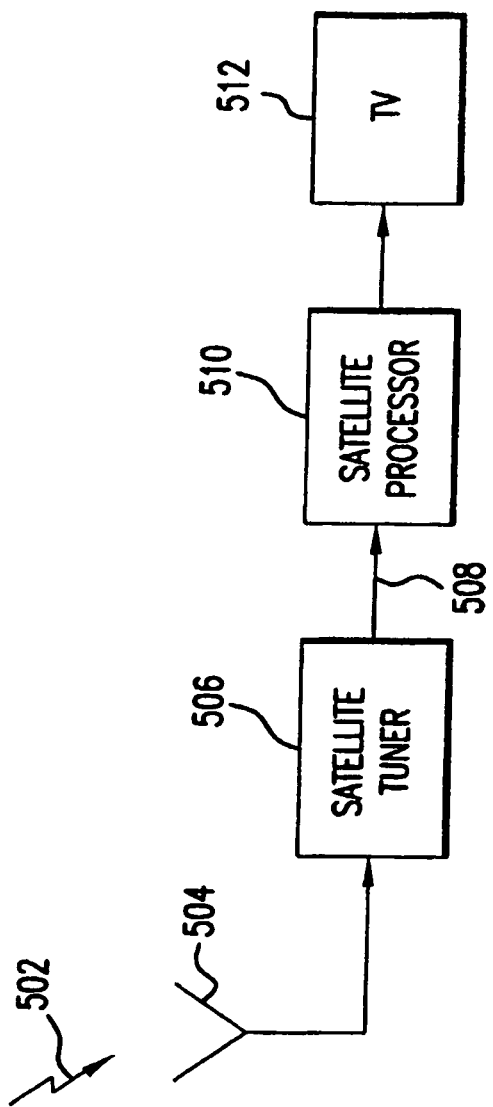
FIG. 5 illustrates a satellite TV environment.

FIG. 5 illustrates a satellite TV environment 500 having an antenna 504, a satellite tuner 506, a processor 510, and a TV monitor 512. The antenna 504 receives a satellite TV signal 502 and sends it to the tuner 506. The tuner 506 down-converts the signal 502 to an IF signal 508. For most satellite TV systems, the IF signal 508 is a digital signal. The processor 510 further processes the IF signal 508, for display on the TV monitor 512. In embodiments, the processor 510 converts the IF signal 508 to a NTSC compatible signal that drives the TV 512.

To summarize the TV delivery systems in FIGS. 1-5, the tuner output is either a NTSC signal at baseband, or an IF signal. The NTSC signal can directly drive a TV monitor. The IF signal exists at higher IF frequency (36 or 44 MHZ) and is chosen to be compatible with specific set-top box and/or cable modem devices.

2. Image Rejection and Linearity

Image rejection and linearity are two key performance parameters for RF down-conversion. Image rejection and linearity requirements depend on the specific application and the corresponding display requirements. Because of its importance, image rejection is explained further as follows.

Figure 6A:
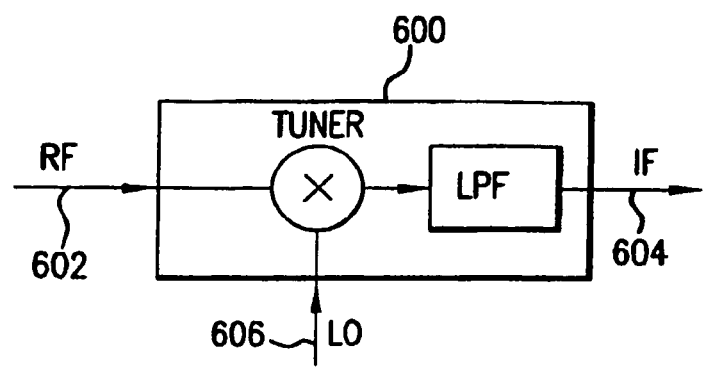
FIG. 6A illustrates a tuner having a mixer and a low pass filter to demonstrate image rejection.
Figure 6B:
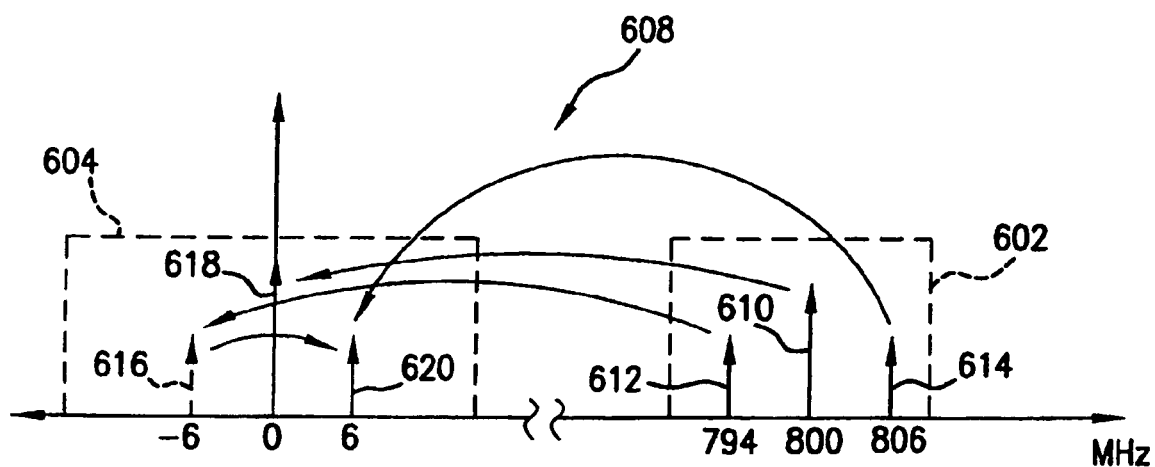
FIG. 6B illustrates a frequency spectrum that illustrates down-conversion and image frequencies.

FIG. 6A illustrates a tuner 600 having a mixer and low pass filter. The tuner 600 down-converts an RF input 602 to an IF output 604, using a LO input 606. FIG. 6B illustrates an example frequency spectrum 608 that illustrates down-conversion and image rejection as performed by the tuner 600. More specifically, the spectrum 608 illustrates an exemplary RF input 602 having a RF carrier 610 at 800 MHZ, and two RF channels 612, 614 at 794 MHZ and 806 MHZ, respectively. For purposes of illustration, the LO input 606 is set to 800 MHZ so that the RF input 602 is frequency translated to 0 Hz by the tuner 600. More specifically, the RF carrier 602 is translated to 0 Hz to create a DC signal 618. The RF channels 612, 614 are translated to −6 MHZ and +6 MHZ, respectively, resulting in IF signals 616 and 620 as shown. However, negative frequencies are a mathematical convenience, and fold over into the positive frequency domain. Assuming no image rejection, the signal 616 folds on top of the signal 620 as shown. Therefore, without image rejection, channels 612 and 614 interfere with each other during down-conversion, and neither channel is recoverable. Image rejection is calculated as the relative amplitude of the desired image compared to the undesired image. For example, if the channel 614 is the desired channel, then the image rejection of the tuner 600 is the ratio of the signal 620 amplitude compared to the signal 616 amplitude. If tuner 600 had perfect image rejection, then the amplitude of the signal 616 would be zero.

3. Conventional Tuner

Figure 7:
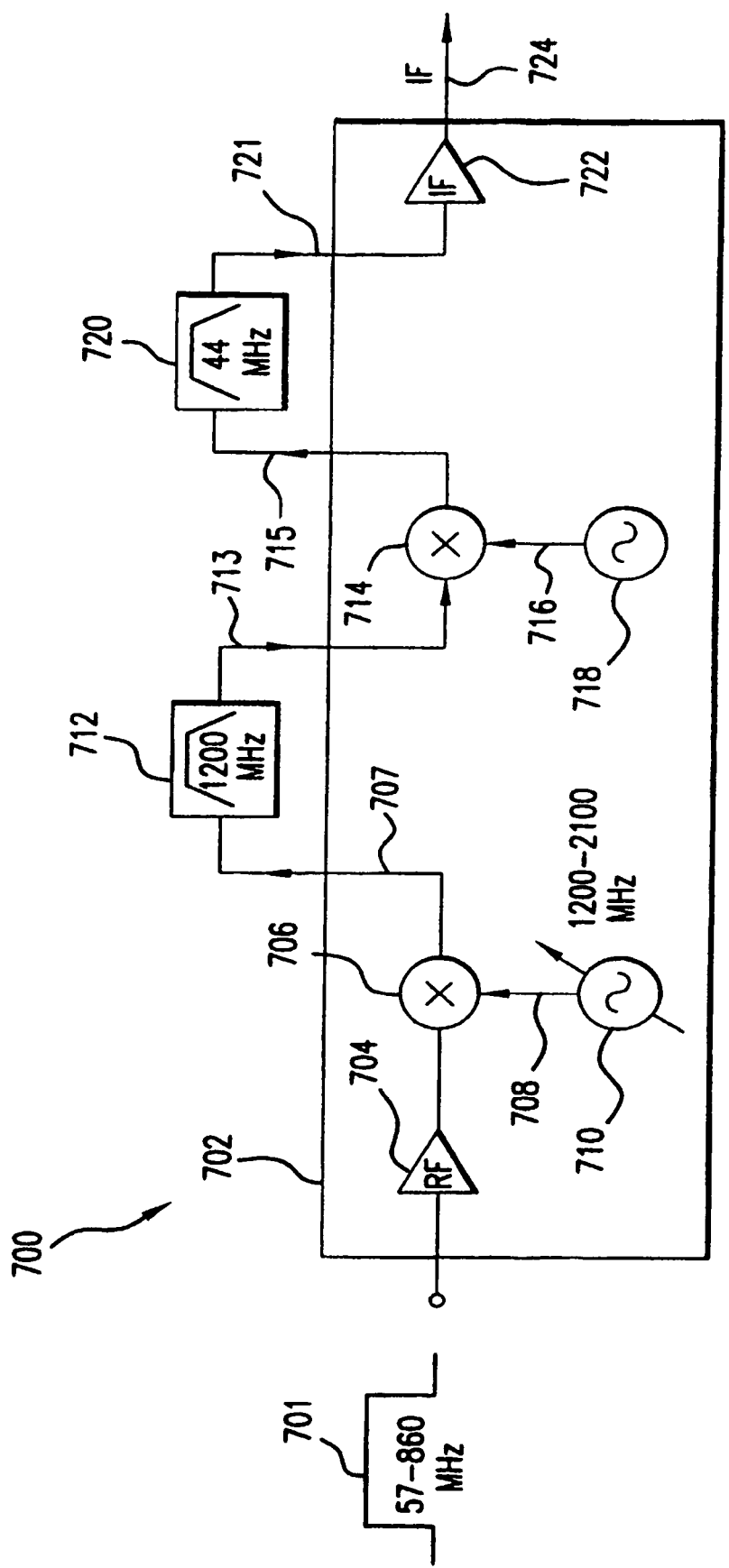
FIG. 7 illustrates a conventional dual conversion tuner.

Before describing the invention in detail, it is useful to describe a conventional tuner for purposes of comparison. FIG. 7 illustrates a conventional tuner 700 that is a dual conversion tuner. The tuner 700 performs two frequency translations (one up-conversion, one down-conversion) to meet the high image rejection requirement. The tuner 700 receives a RF signal 701 having multiple TV channels that each have a 6 MHZ bandwidth, and collectively occupy a frequency range of 57-860 MHZ. The tuner 700 down-converts a selected channel from the RF signal 701, and outputs the selected channel as an IF signal 724. In embodiments, the frequency of the IF signal 724 is 36 MHZ, or 44 MHZ, or some other desired IF frequency.

The detailed operation of the conventional tuner 700 is as follows. An RF amplifier 704 amplifies the RF input signal 701 prior to frequency translation. A first mixer 706 mixes the RF input signal 701 with a variable LO signal 708. The LO 710 varies the frequency of the LO signal 708 from 1200 to 2100 MHZ. Therefore, the RF input signal 701 is up-converted to a frequency above the 57-860 MHZ band, resulting in an up-converted signal 707. The up-converted signal 707 is sent off-chip to a SAW filter 712, which has a narrow passband at 1200 MHz. The SAW filter 712 selects a desired channel 713 that falls within its narrow passband, and substantially rejects all of the remaining channels. Therefore, a particular channel is selected by varying the frequency of the LO signal 708 so that the desired channel is up-converted into the passband of the SAW filter 712.

Still referring to FIG. 7, the desired channel 713 is sent back on-chip to a second mixer 714, which is driven by a fixed local oscillator 718. The mixer 714 down-converts the desired channel using a fixed local oscillator signal 716, resulting in an IF signal 715. Given that the SAW filter is centered at 1200 MHZ, the frequency of the LO signal 716 is appropriately selected to provide an IF at 36 MHZ, 44 MHZ, or some other desired IF frequency. The off-chip IF filter 720 further removes any unwanted harmonics and images from the IF signal 715, resulting in the IF signal 721. The IF signal 721 is amplified by the IF amplifier 722, to produce the IF output 724.

The dual conversion architecture of the conventional tuner 700 has several disadvantages. For instance, there are two of each component including two mixers, two high frequency local oscillators, and two off-chip filters. This results in a high DC power requirement (about 3 watts) because each of the two mixers is driven by a separate high frequency local oscillator, where each local oscillator (LO) must generate sufficient power at high frequencies to operate its corresponding mixer. A second disadvantage is that the SAW filter is an off-chip component that prevents a single chip tuner solution, which has inherent manufacturing advantages. Additionally, electrical performance is degraded by taking a high frequency signal off-chip (and back on-chip) because of the inherent parasitics that are involved.

4. Direct Conversion Tuner

Figure 8:
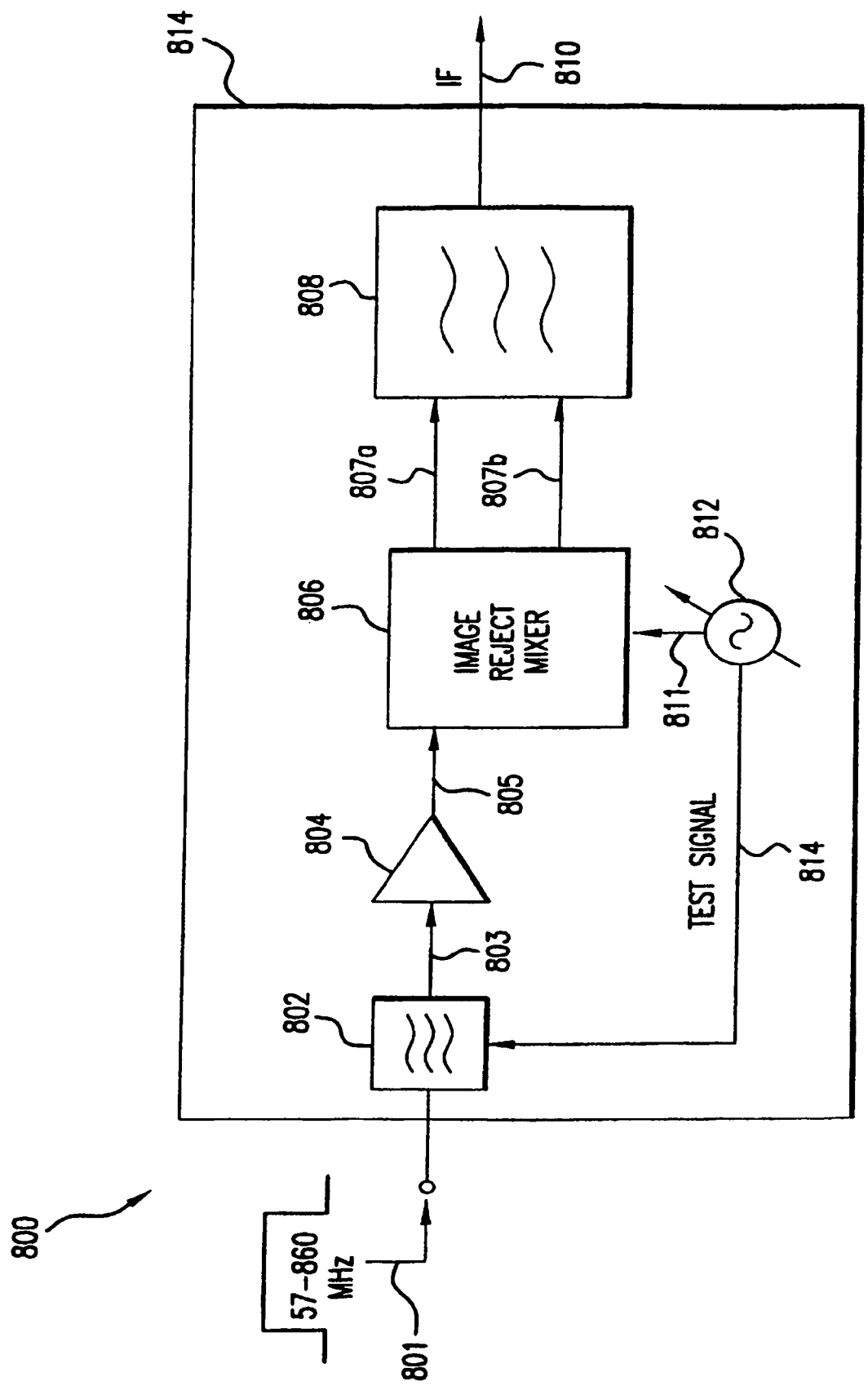
FIG. 8 illustrates a direct conversion tuner according to embodiments of the invention.
Figure 9:
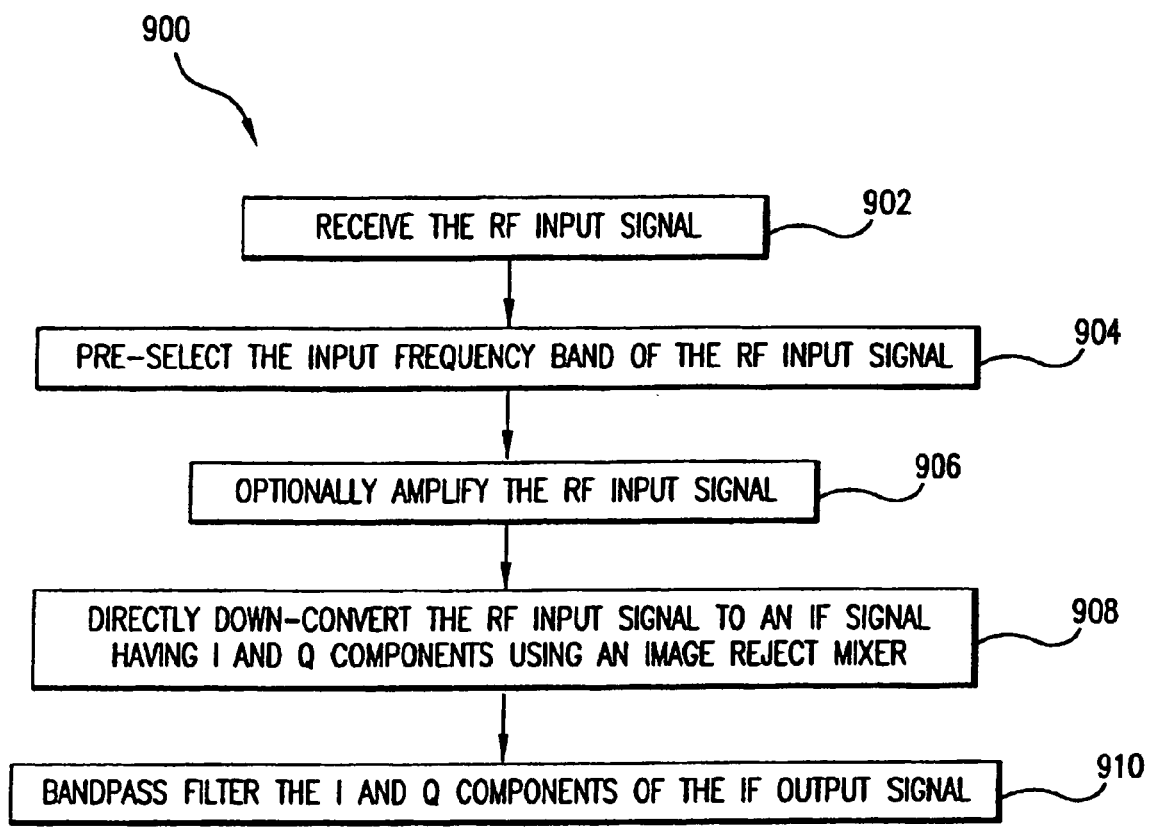
FIG. 9 illustrates a flowchart associated with the direct conversion tuner in FIG. 8, according to embodiments of the invention.

FIG. 8 illustrates a direct conversion tuner 800 according to embodiments of the invention. The tuner 800 receives an RF input signal 801 having multiple TV or cable channels, and down-converts the RF input signal 801 to an IF signal 810. In embodiments, the IF signal 810 is at 36 MHZ, or 44 MHZ, which are popular frequencies for set-top box and cable modem devices. The tuner 800 includes a pre-select filter 802, an amplifier 804, an image reject mixer 806, and a polyphase filter 808. In embodiments, all of the mentioned components are on a common semiconductor substrate 814. The detailed operation of the tuner 800 is described in reference to a flowchart 900 that is shown in FIG. 9.

In step 902, the pre-select filter 802 receives the RF input signal 801. In embodiments, the RF input signal 801 includes multiple frequency channels from 57 MHZ to 860 MHZ, with each channel having a 6 MHZ bandwidth.

In step 904, the pre-select filter 802 pre-selects the input frequency band of interest, and rejects out of band signals, producing a RF signal 803. The pre-select filter 802 is a lowpass or bandpass filter having a desired passband of interest. For example, for broadcast or cable TV, the frequency band of interest is approximately 57-860 MHz. For satellite reception, the frequency band can be much higher depending on the specific system that is used.

In step 906, the amplifier 804 amplifies the RF signal 803, resulting in a RF signal 805. In embodiments, the amplifier 804 is a low noise amplifier.

In step 908, the image reject mixer 806 directly down-converts the RF signal 805 to an IF signal 807 having in-phase and quadrature components 807a and 807b, respectively. The image reject mixer 806 mixes the RF input signal 805 with a LO signal 811 that is generated by a variable LO 812. For direct down-conversion, the LO signal 811 is in-band. In other words, the frequency of the LO signal 811 is in the same frequency band as the channels that make-up the RF input signal 801.

In embodiments, the LO 812 is a voltage controlled oscillator (VCO), where the oscillator frequency is controlled by a voltage input. In alternate embodiments, the LO 812 includes one or more phase locked loops.

In step 910, the polyphase filter 808 selects the channel of interest from the component IF signals 807a and 807b, resulting in an output IF signal 810. The polyphase filter 808 has a narrow passband at is the desired IF frequency. For example, the polyphase filter 808 can be fabricated to have a passband centered at 36 or 44 MHZ. Channel selection is performed by changing the frequency of the LO signal 811, and thereby causing the desired channel to shift into the passband of the polyphase filter 808.

FIG. 10A depicts a table 1002 that further illustrates channel selection using the tuner 800, when down-converting to a 36 MHZ IF. More specifically, the table 1002 indicates two LO frequencies that can be used to down-convert specific RF input channels to an IF frequency of 36 MHz. For example, if channel 4 is the desired channel, then the frequency of the LO 812 should be set to 111 MHZ or 39 MHZ. By setting the LO 812 to 111 MHZ or 39 MHZ, then CH 4 will be down-converted to 36 MHZ and is shifted into the passband of the polyphase filter 808. Continuing this example, assuming that the LO is set to 111 MHZ, an unwanted image frequency occurs at 147 MHZ, which is channel 16 in this example. However, this image frequency is not down-converted to the 36 MHZ IF because of the image reject features of the image reject mixer 806.

Figure 10B:
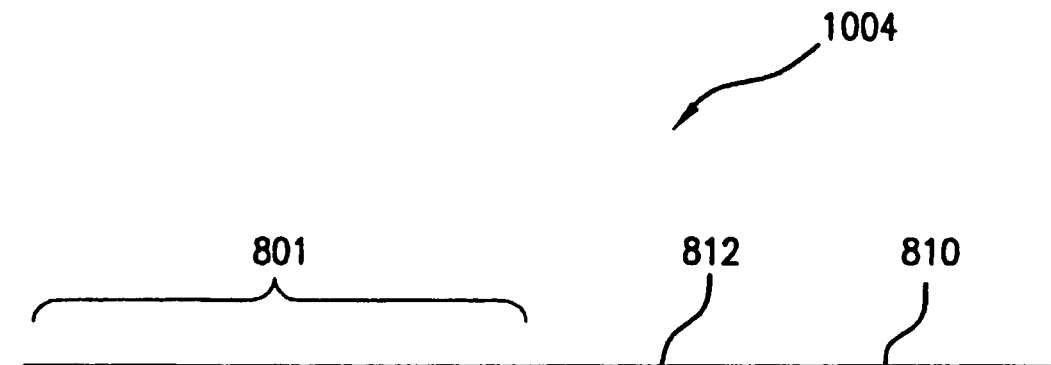
FIG. 10B illustrates a table of LO frequencies associated with a 44 MHZ IF produced by single step down-conversion, according to embodiments of the invention.

FIG. 10B illustrates a table 1004 that is similar to the table 1002 except that the LO frequencies are determined for a 44 MHZ IF, instead of a 36 MHZ IF.

In embodiments, the steps 904-908 are performed using differential circuitry that operates on differential signals, as will be understood by those skilled in the arts. In alternate embodiments, the steps 904-908 are performed using single-ended circuitry that operates on single-ended (i.e. non-differential) signals.

4.1 Image Reject Mixer

As shown, the direct conversion TV tuner 800 includes an image reject mixer 806 for down-conversion. The image reject mixer 806 is key to performing the down-conversion operation in a single frequency conversion, instead of the conventional dual-conversion operation. In other words, the image reject feature supplants the need for a dual conversion architecture and the off-chip SAW filter.

Figure 11:
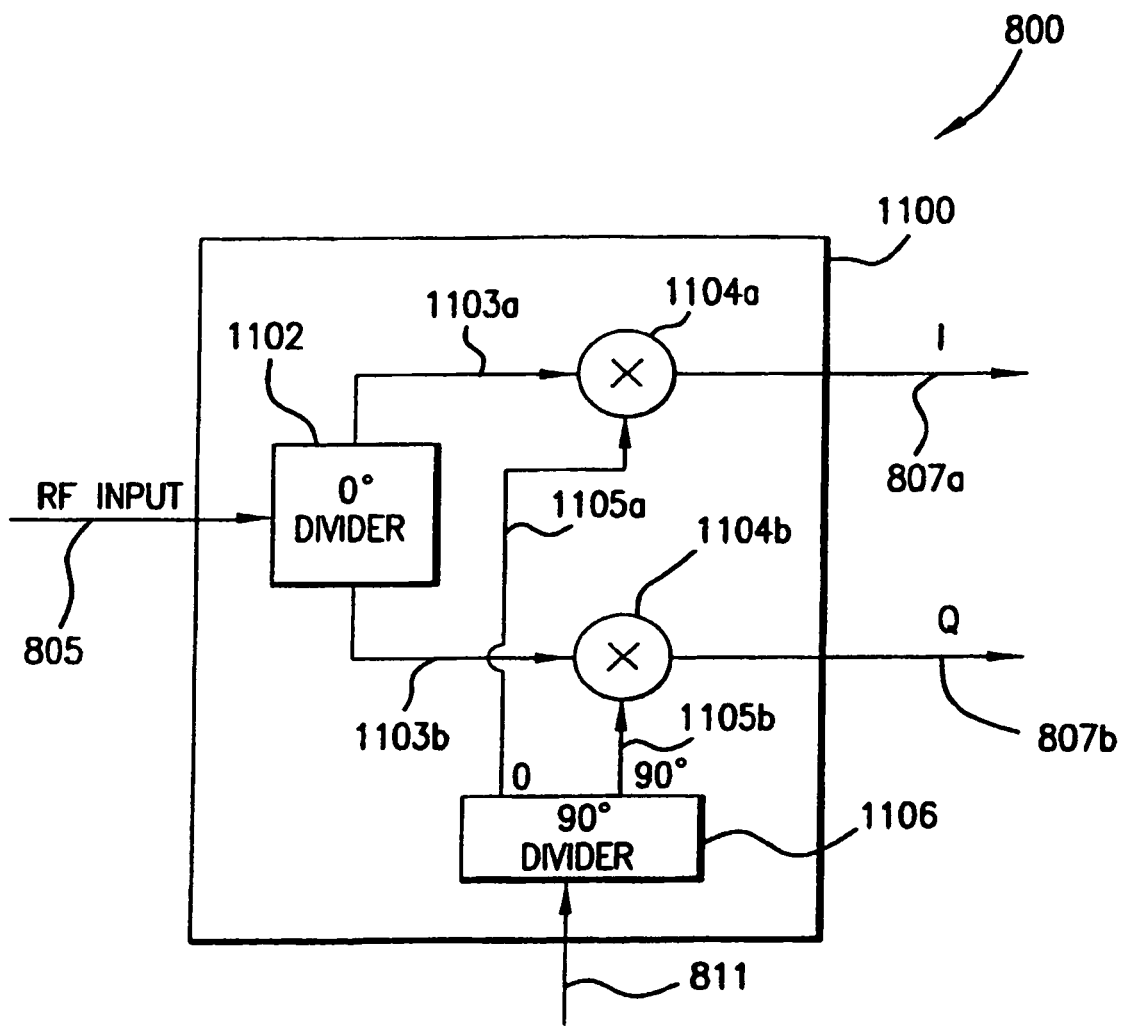
FIG. 11 illustrates an image reject mixer according to embodiments of the invention.

FIG. 11 illustrates an image reject mixer 1100 as an embodiment of the image reject mixer 806 in FIG. 8. Image reject mixer 1100 includes an in-phase divider 1102, component mixers 1104a, 1104b, and a quadrature divider 1106. The in-phase divider 1102 receives the RF input signal 805, and divides the signal 805 into component signals 1103a and 1103b, where the signals 1103a and 1103b are substantially equal phase and equal amplitude. The quadrature divider 1106 receives the LO signal 811 and divides the LO signal 811 into component LO signals 1105a and 1105b, where the signal 1105b is phase shifted by 90 degrees relative to the signal 1105a. The mixer 1104a mixes the I component signal 1103a with the LO signal 1105a, resulting in the in-phase IF component 807a. The mixer 1104b mixes the component signal 1103b with the LO signal 1105b, resulting in the quadrature IF component 807b. The in-phase IF component 807a and the quadrature IF component 807b are combined by the polyphase filter 808 (FIG. 8). The image rejection occurs when the I and Q components 807a, 807b are combined because the phase relationship between I and Q components causes signal cancellation at the image frequency.

Theoretically, infinite image rejection is achievable if the I and Q channels of the mixer 1100 are perfectly balanced at the frequency of interest. However, if the phase relationship between the I and Q channels varies from 90 degrees at some frequency, then the actual image rejection deteriorates at this frequency. Additionally, if the amplitude varies between the I and Q channels, then the image rejection also deteriorates. The amplitude and phase relationship between the I and Q channels is often collectively referred to as I/Q balance. Perfect I/Q balance is achieved when the amplitude response of the I and Q channels is equal over frequency, and the phase difference between the I and Q channels is 90 degrees over frequency.

The invention is not limited to the IQ image reject mixer that is shown in FIG. 11. Other image reject mixers can be utilized, as will be understood by those skilled in the arts, including but not limited to passive mixers.

4.2. Tuner Calibration

As discussed above, the actual image rejection that is achieved for an image reject mixer deteriorates if there are amplitude and/or phase errors between the I and Q channels (i.e. I/Q imbalance). More specifically, a small I/Q imbalance over frequency can cause a large variation in the corresponding image rejection. In a high volume manufacturing environment, these amplitude and phase errors can originate from part-to-part variations of electrical parameters that are within stated tolerances of the electrical components. The result is that image rejection can be reduced to below a desired level.

4.2.1 Overview of Tuner Calibration for I/Q Balance

Figure 12:
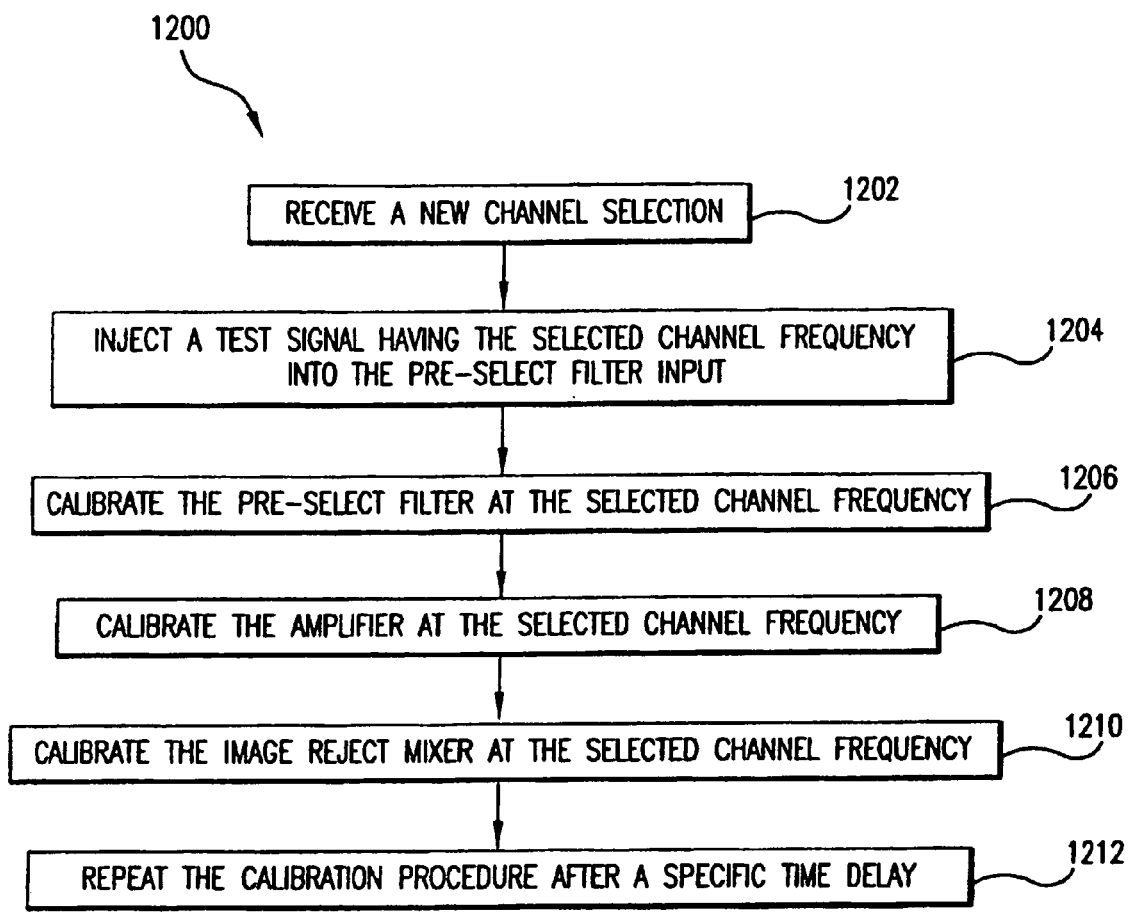
FIG. 12 illustrates a flowchart for calibrating the tuner according to embodiments of the present invention.

The tuner 800 can be calibrated for each channel frequency to correct for I/Q imbalance, and therefore improve image rejection. The calibration is done by injecting a test signal at the selected channel frequency into the tuner, and adjusting the tuner components to improve I/Q balance, and therefore image rejection. The calibration procedure is described in more detail according to a flowchart 1200 that is shown in FIG. 12.

In step 1202, a new channel selection is received. The selected channel is one of several channels carried by the RF input signal 801. In embodiments, the RF input signal 801 includes multiple channels from 57 MHZ to 860 MHZ, with each channel having a 6 MHZ frequency bandwidth.

In step 1204, the LO 812 generates a test signal 814 at the selected channel frequency. The test signal 814 is injected into the input of the filter 802.

In step 1206, the pre-select filter 802 is calibrated to improve I/Q balance at the frequency of the selected channel.

In step 1208, the amplifier 804 is calibrated to improve I/Q balance at the frequency of the selected channel.

In step 1210, the image reject mixer 806 is calibrated to improve I/Q balance at the frequency of the selected channel. More specifically, regarding phase, the image reject filter 806 is calibrated so that the phase difference between the I and Q channels is as close to 90 degree as possible, so as to maximize image rejection.

In step 1212, the calibration procedure, defined by steps 1204-1210, can be repeated after a pre-defined time delay. The calibration procedure is repeated, even though the channel has not been changed, to compensate for circuit parameter variations that are time sensitive. For instance, electrical characteristics of components may vary over time because of temperature variations, especially at initial power-up.

4.2.2 Detailed Discussion of Tuner Calibration for I/Q Balance

Figure 13:
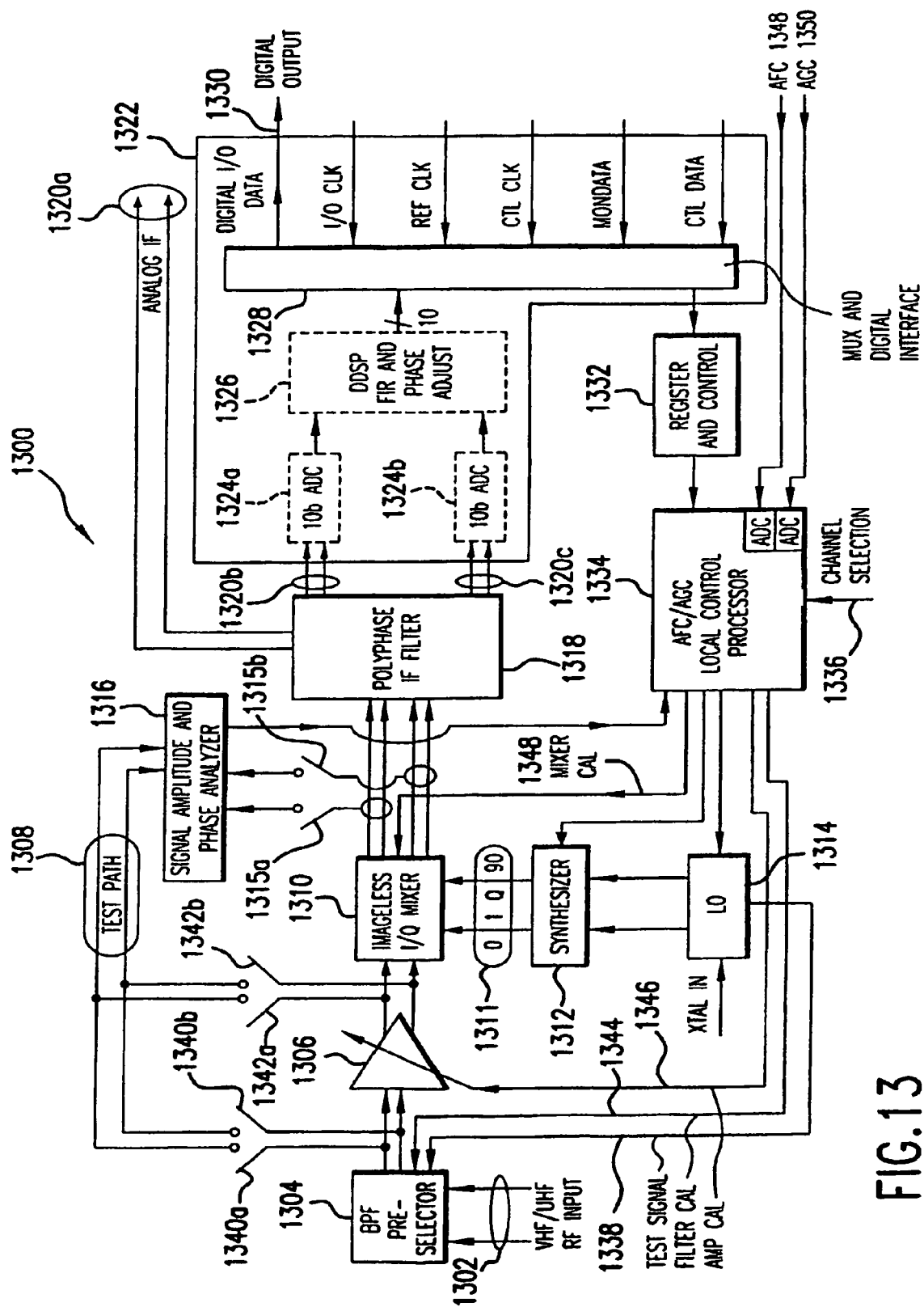
FIG. 13 illustrates a direct conversion tuner, which can be calibrated to improve image rejection according to embodiments of the invention.

FIG. 13 illustrates tuner 1300, which is a more detailed embodiment of the tuner 800. The tuner 1300 will be utilized to further explore tuner calibration for image rejection, according to embodiments of the present invention. The tuner 1300 includes a bandpass pre-select filter 1304, an amplifier 1306, an I/Q image reject mixer 1310, a local oscillator 1314, and a polyphase filter 1318, which are all similar to the corresponding components in tuner 800. Additionally, the tuner 1300 includes a synthesizer 1312, a signal amplitude and phase analyzer 1316 (hereinafter signal analyzer 1316), a signal processing module 1322, a register/control module 1332, and a local processor 1334, which are discussed further below.

The tuner 1300 operates similar to the tuner 800, but includes some additional features. More specifically, the tuner 1300 receives an RF input signal 1302 having multiple VHF and UHF channels. The tuner 1300 down-converts a selected channel from the RF input signal 1302 to produce an analog IF signal 1320. The analog IF signal 1320 exists at an IF frequency of 36 MHZ, or 44 MHZ, or some other useful frequency, and is compatible with currently available set-top boxes. The down-conversion and channel selection are performed similar to that described for the tuner 800. The signal processing module 1322 also receives the analog IF signal 1320 and converts it into a digital signal 1330 using an A/D converter 1324, a FIR filter 1326, and a MUX 1328.

Figure 14A:
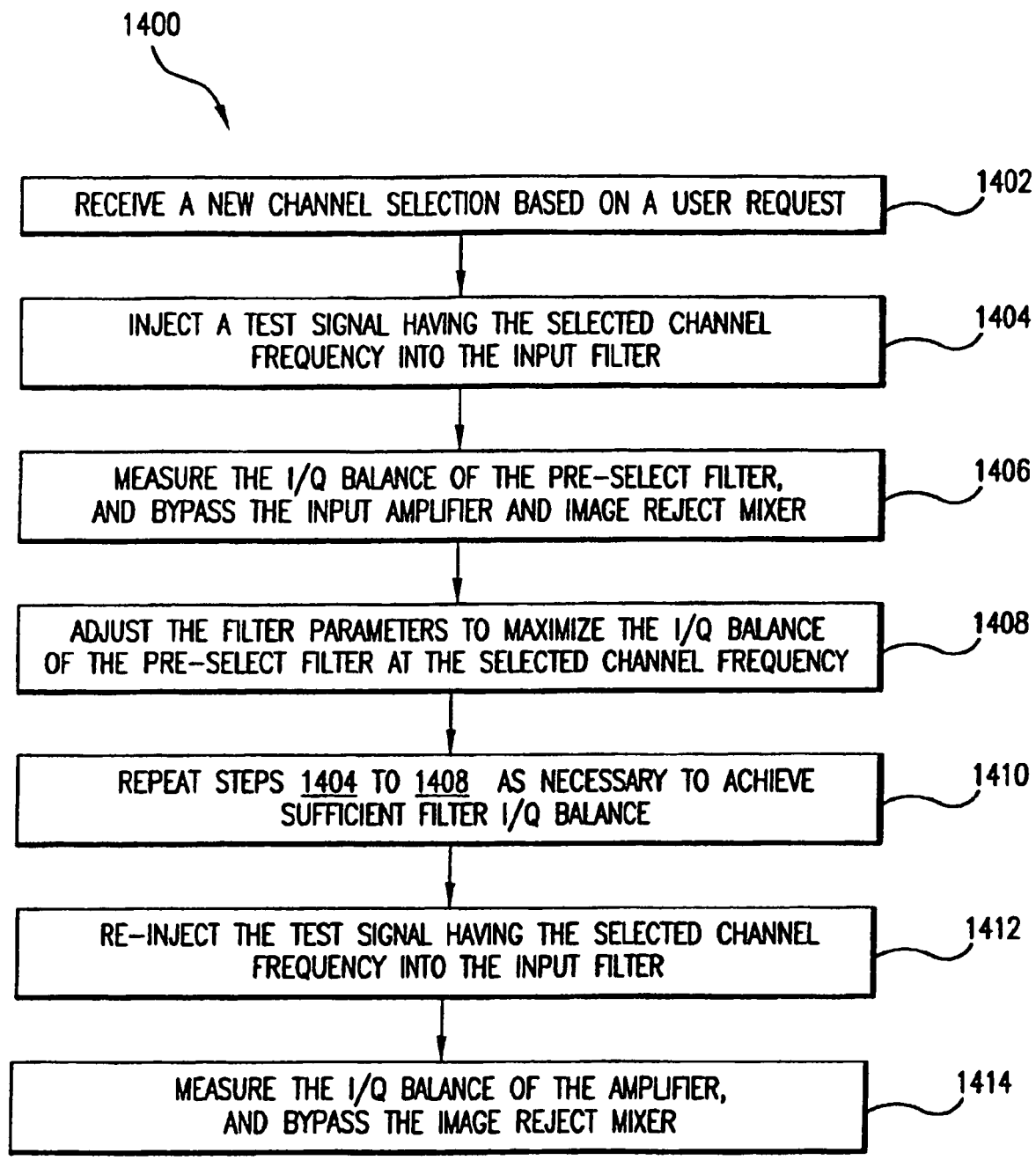
FIGS. 14A-B illustrate a flowchart for calibrating the tuner in FIG. 14 according to embodiments of the invention.
Figure 14B:
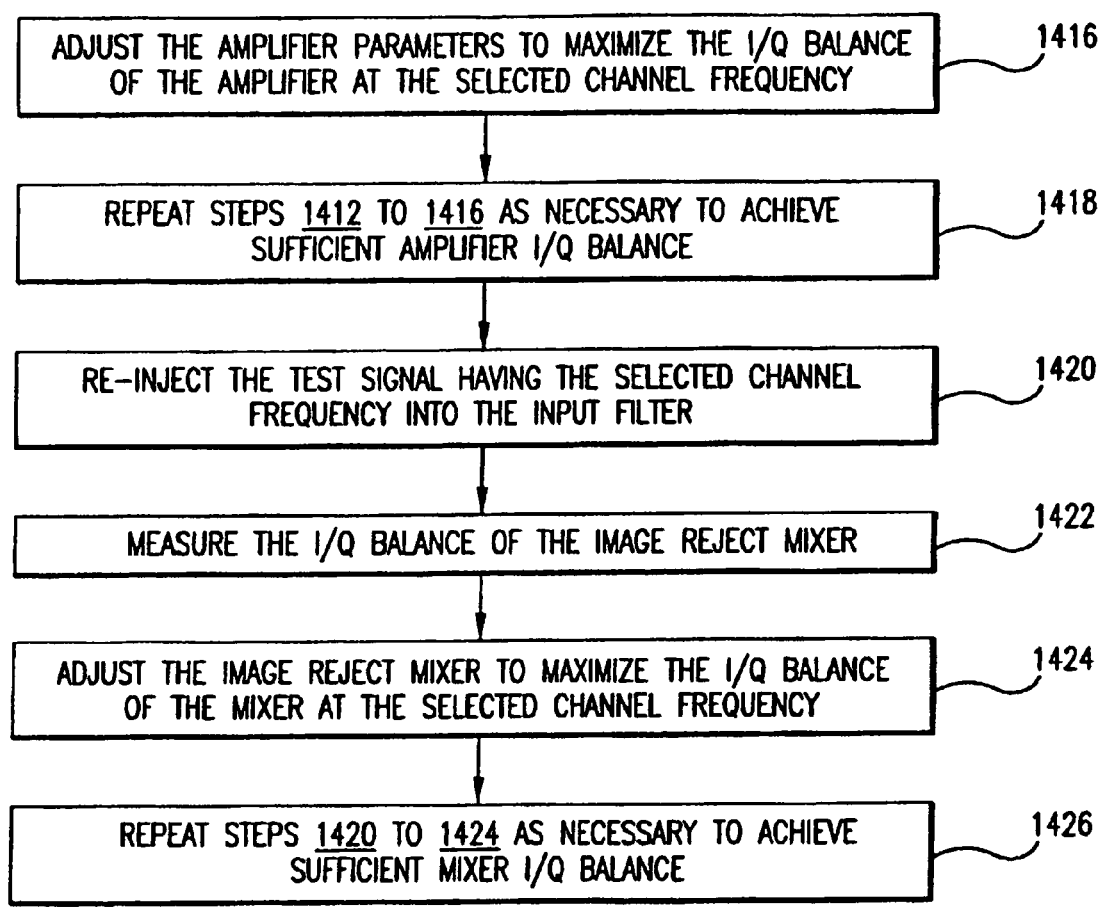

Additionally, the tuner 1300 can be calibrated to maximize I/Q balance for each new channel selection. The calibration of the tuner 1300 is a three step process, where the filter 1304, the amplifier 1306, and the image reject mixer 1310 are individually calibrated to maximize overall tuner image rejection. The calibration is performed by injecting a test signal at the selected channel frequency into the filter 1304, and then separately examining I/Q balance at the outputs of the filter 1304, amplifier 1306, and the image reject mixer 1310. As described herein, the maximum image rejection is achieved when there is a balanced amplitude, but a 90 degree phase shift between the I and Q channels. The calibration of the tuner 1300 is described in detail with reference to the flowchart 1400 (FIGS. 14A-B) as follows.

In step 1402, the local processor 1334 receives a channel selection input 1336, which identifies a TV channel that is to be displayed.

In step 1404, the LO 1314 generates a test signal 1338 at the selected channel frequency. The test signal 1338 is injected into the input of the pre-select filter 1304.

In step 1406, the signal analyzer 1316 measures the I/Q balance of the filter 1304, based on the test signal input 1338. More specifically, the switches 1340 are closed so that the filter 1304 output is connected to the signal analyzer 1316, through the test path 1308. As such, the amplifier 1306 and the I/Q mixer 1310 are by-passed so the filter characteristics can be analyzed without being influenced by the amplifier 1306 or the mixer 1310. The signal analyzer measures the amplitude and phase for the I and Q channels at the output of the filter 1304, and determines the I/Q balance between the I and Q channels. As discussed herein, the I/Q balance is the amplitude balance and phase difference between the I and Q channels. The I/Q balance information is forwarded to the processor 1334 for further processing. In embodiments, the signal analyzer incorporates an RF power meter.

In step 1408, the processor 1334 calibrates the filter 1304 to maximize the I/Q balance at the selected channel frequency using a filter calibration signal 1344. More specifically, the parameters of the filter 1304 are adjusted so that the amplitude of the I and Q channels are balanced, and so that the phase difference between the I and Q channels is substantially 90 degrees. In embodiments, the filter parameters that are adjusted include one or more of the following: center frequency, bandwidth, gain, and phase.

In step 1410, the steps 1404-1408 are repeated as necessary to produce sufficient I/Q balance in the filter 1304 at the selected channel frequency.

In step 1412, the LO 1314 re-generates the test signal 1338 at the selected channel frequency, and injects the test signal 1338 into the bandpass filter 1304.

In step 1414, the signal analyzer 1316 measures the I/Q balance of amplifier 1306, based on the test signal input 1338. More specifically, the switches 1340 are opened, and switches 1342 are closed. Therefore, the filter 1304 output is connected to the amplifier 1306 input, and the amplifier 1306 output is connected directly to the signal analyzer 1316, bypassing the image reject mixer 1310. Since the filter 1304 was calibrated in steps 1404-1410, any I/Q imbalance that is measured by the signal analyzer 1316 is likely to be caused by the amplifier 1306. The I/Q balance information for the amplifier 1306 is forwarded to the processor 1334.

In step 1416, the processor 1334 calibrates the amplifier 1306 to maximize the I/Q balance at the selected channel frequency using an amplifier calibration signal 1346. More specifically, the parameters of the amplifier 1306 are adjusted so that the amplitude of the I and Q channels are balanced, and so that the phase difference between the I and Q channels is 90 degrees. In embodiments, the parameters that are adjusted include the gain and phase of the amplifier.

In step 1418, the steps 1412-1416 are repeated as necessary to achieve sufficient I/Q balance in the amplifier 1306 at the selected channel frequency.

In step 1420, the LO 1314 re-generates the test signal 1338 at the selected channel frequency, and injects the test signal 1338 into the bandpass filter 1304.

In step 1422, the signal analyzer 1316 measures the I/Q balance of the image reject mixer 1310. More specifically, the switches 1340 and 1342 are opened so that the test path 1308 is deactivated. Additionally, the switches 1315a and 1315b are closed. Therefore, the filter 1304, amplifier 1306, and I/Q mixer 1310 are connected together, with the mixer 1310 output being connected to the signal analyzer 1316. Since the filter 1304 and amplifier 1306 were calibrated in steps 1404-1418, any I/Q imbalance that is measured by the signal analyzer 1316 is likely to be caused by the image reject mixer 1310.

Figure 15:
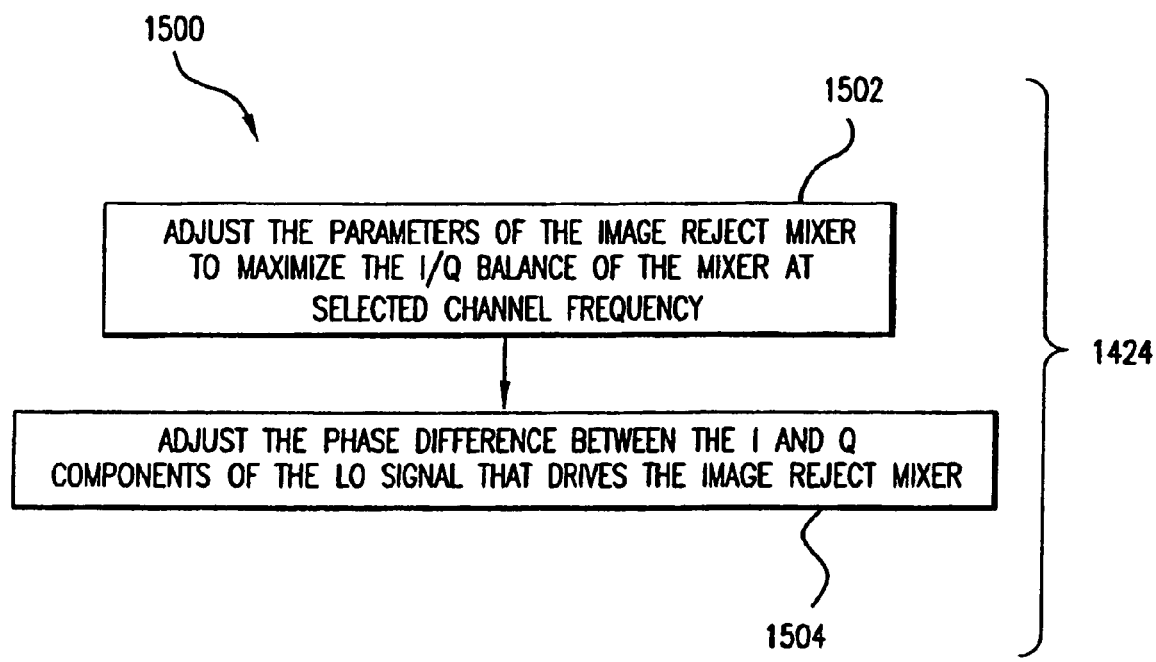
FIG. 15 illustrates a flowchart for calibrating an image reject mixer, according to embodiments of the invention.

In step 1424, the processor 1334 calibrates the image reject mixer 1310 to maximize the image rejection at the selected channel frequency. This is a two step process as described by flowchart 1500 in FIG. 15. First, in step 1502, the parameters of the mixer 1310 are adjusted using a mixer cal signal 1348 to get the best the I/Q balance for the mixer 1310 alone. In embodiments, the parameters that are adjusted include the gain and phase of the mixer. Next, in step 1504, the relative phase-shift between the I and Q components of a LO signal 1311 is adjusted to produce the maximum I/Q balance at the output of image reject mixer 1310. In other words, the phase difference between the I and Q components of the LO signal 1311 is varied from 90 degrees to compensate for any residual I/Q imbalance that is left in the mixer 1310 after step 1502.

In step 1426; the steps 1420-1424 are repeated as necessary to produce sufficient I/Q balance at the output of the mixer 1304.

4.2.3 Automatic Frequency Control and Automatic Gain Control

In a terrestrial TV transmission system, the frequency channels of the RF input signal can vary by a few percent from their expected frequency. These frequency errors cause the NTSC signal to be shifted off of baseband, which produces unwanted distortion to appear in the TV picture that is ultimately displayed. The frequency errors stem from inaccuracies in the various TV transmitters that are utilized to transmit the individual TV channels. These inaccuracies are not typically present in cable and satellite transmissions because there is inherently more uniformity in the transmitter equipment that is used for cable and satellite systems.

To address frequency variation in terrestrial systems, conventional TV baseband processors examine the NTSC signal to determine if the NTSC signal is shifted in frequency, which indicates the corresponding RF input signal is also shifted in frequency. If a frequency shift is detected, then an automatic frequency control (AFC) signal is sent to the TV tuner to adjust the frequency of the local oscillator and thereby compensate for the frequency error in the RF input signal. In other words, the local oscillator frequency is adjusted as necessary to track the frequency error of RF input signal. Referring to the tuner 1300, the local processor 1334 receives an AFC signal 1348 that is utilized to adjust the LO 1314 as needed, to track any frequency errors in the RF input 1302.

Similar to the AFC signal 1348, an automatic gain control (AGC) signal 1350 is received by the processor 1334. The AGC signal 1350 contains gain control information that is used to compensate for amplitude variations of the channels in the RF input signal 1302. For example, one channel in the signal 1302 may be stronger or weaker than the other channels in the signal 1302. Therefore, the gain of amplifier 1306 can be adjusted appropriately to compensate for these amplitude variations.

4.3 Post-IF Processing

The tuner 1300 outputs an analog IF signal 1320 at 36 MHZ, 44 MHZ, or some other IF frequency that is compatible with available set-top box or cable modem devices. However, some cable customers do not want to utilize a set-top box for cost/complexity reasoning. Therefore, it is desirable for the tuner to output a baseband NTSC signal, which can drive a TV monitor without the need for a set-top box.

Figure 16:
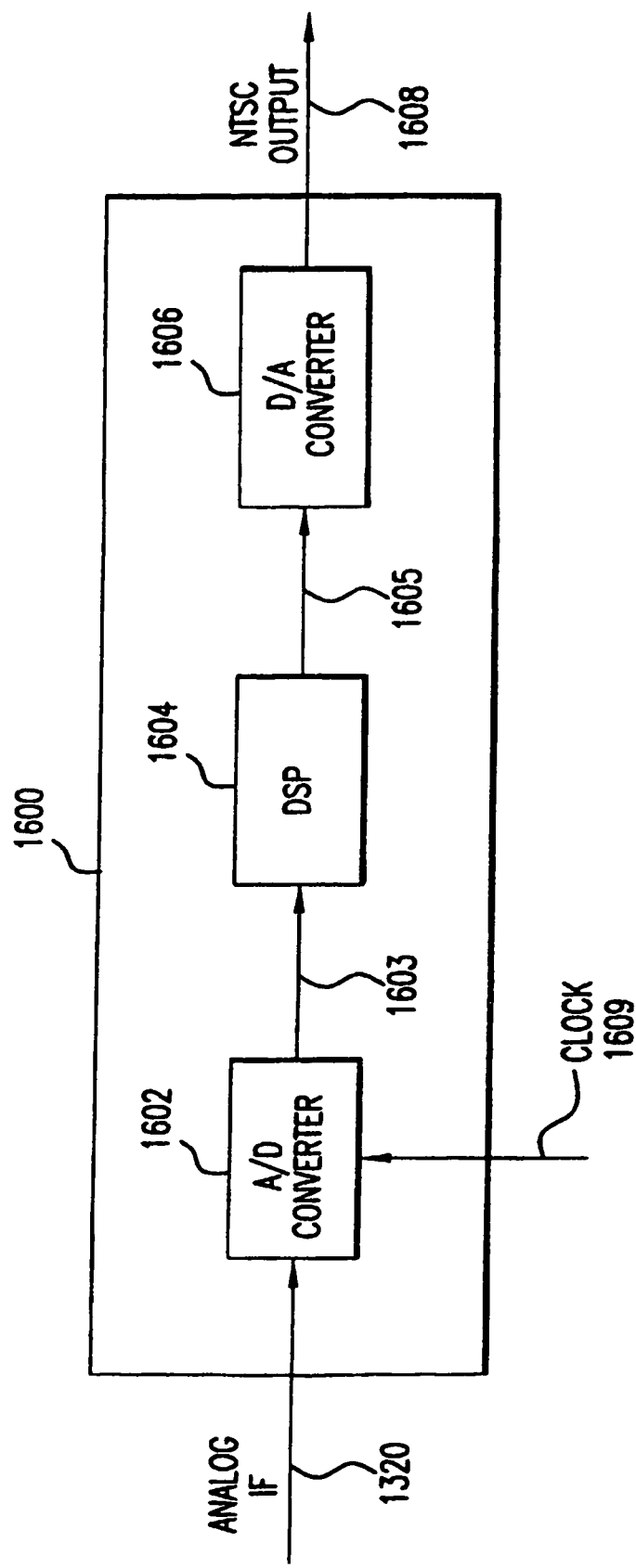
FIG. 16 illustrates a post IF processing module for generating a NTSC output signal, according to embodiments of the invention.

FIG. 16 illustrates a post processing module 1600 that converts the analog IF signal 1320 to a baseband NTSC output signal 1608. The post processing module 1600 includes an A/D converter 1602, a digital signal processor 1604, and a D/A converter 1606. During operation, the MD converter 1602 samples and down-converts the analog IF signal 1320 according to a clock signal 1609, to generate a digital signal 1603. In embodiments, the clock signal 1609 is a sub-harmonic clock signal so that the A/D converter 1602 sub-samples the analog IF signal 1320. The DSP 1604 processes the digital signal 1603 to produce a NTSC digital signal 1605. In other words, the NTSC signal 1605 contains the NTSC information at baseband, but in a digital format, instead of the desired analog format. Finally, the D/A converter 1606 converts the digital signal 1605 to an analog NTSC signal 1608, which can drive a TV monitor.

5. Other Applications

The tuner invention described herein has been discussed in terms of processing broadcast television signals and/or cable signals. However, the invention is not limited to TV applications. The tuner invention is applicable to any application that requires down-conversion of an RF signal to an IF signal and/or a baseband signal, as will be understood by those skilled in the arts. These other applications are within the scope and spirit of the present invention.

6. Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

The invention claimed is:

1. A tuner, comprising:
a pre-select filter configured to receive a plurality of channels, and to output a Radio Frequency (RF) signal based on the received plurality of channels;
a local oscillator configured to generate a control signal having a tunable frequency;
an image reject mixer configured to down-convert the RF signal, and to generate an in-phase component signal and a quadrature component signal based on the tunable frequency of the control signal; and
a polyphase filter configured to select a selected channel from the received plurality of channels based on the in-phase component signal and the quadrature component signal, wherein
the tunable frequency is within a frequency band of the RF signal, and
wherein the local oscillator is configured to generate a test signal having a test frequency based on a frequency of the selected channel, wherein an imbalance between an amplitude response of the in-phase component signal and an amplitude response of the quadrature component signal is determined based on the test signal.

2. The tuner of claim 1, wherein the image reject mixer is configured to down-convert the RF signal without the RF signal being previously up-converted in the tuner.

3. The tuner of claim 1, wherein the polyphase filter is configured to have a passband frequency that is centered at 36 MHz or 44 MHz.

4. The tuner of claim 1, wherein the down-conversion of the RF signal to the in-phase component signal and the quadrature component signal is the only frequency translation performed by the image reject mixer on the RF signal.

5. The tuner of claim 1, wherein the tuner is fabricated on a single semiconductor substrate.

6. The tuner of claim 1, wherein the polyphase filter is configured to generate an Intermediate Frequency (IF) signal based on the in-phase component signal and the quadrature component signal, the tuner further comprising:
a processor configured to convert the IF signal to a National Television Standards Committee (NTSC) compatible signal, and to drive a monitor to display the converted NTSC compatible signal.

7. The tuner of claim 1, wherein the image reject mixer comprises:
a first divider configured to divide the RF signal into a first component signal and a second component signal, the first component signal and the second component signal having an equal phase and an equal amplitude;
a second divider configured to divide the control signal into a third component signal and a fourth component signal, the third component signal having a phase that is shifted by 90° relative to a phase of the fourth component signal; and
a mixer configured to mix the first component signal and the third component signal to generate the in-phase component signal, and to mix the second component signal and the fourth component signal to generate the quadrature component signal.

8. The tuner of claim 1, wherein the pre-select filter is configured to be periodically calibrated, based on the test frequency of the test signal, to support correction of the determined imbalance.

9. A tuner, comprising:
a pre-select filter configured to receive a plurality of channels, and to output a Radio Frequency (RF) signal based on the received plurality of channels;
a local oscillator configured to generate a control signal having a tunable frequency;
an image reject mixer configured to down-convert the RF signal, and to generate an in-phase component signal and a quadrature component signal based on the tunable frequency of the control signal; and
a polyphase filter configured to select a selected channel from the received plurality of channels based on the in-phase component signal and the quadrature component signal, wherein
the tunable frequency is within a frequency band of the RF signal, and
wherein the local oscillator is configured to generate a test signal having a test frequency based on a frequency of the selected channel, wherein an imbalance between a desired phase difference between a phase of the in-phase component signal and a phase of the quadrature component signal is determined based on the test signal.

10. The tuner of claim 9, wherein the pre-select filter is configured to be periodically calibrated, based on the test frequency of the test signal, to support correction of the determined imbalance.

11. A method, comprising:
receiving, in a pre-select filter, a plurality of channels;
generating, in the pre-select filter, a Radio Frequency (RF) signal based on the received plurality of channels;
generating, in a local oscillator, a control signal having a tunable frequency, the tunable frequency being within a frequency band of the RF signal;
down-converting, in an image reject filter, the RF signal and generating an in-phase component signal and a quadrature component signal based on the tunable frequency of the control signal;
selecting, in a polyphase filter, a selected channel from the received plurality of channels based on the in-phase component signal and the quadrature component signal;
generating a test signal having a test frequency based on a frequency of the selected channel; and
determining, based on the test signal, an imbalance between an amplitude response of the in-phase component signal and an amplitude response of the quadrature component signal.

12. The method of claim 11, wherein the down-converting includes down-converting the RF signal without previously up-converting the RF signal in the tuner.

13. The method of claim 11, wherein the down-converting of the RF signal to the in-phase component signal and the quadrature component signal is the only frequency translation performed on the RF signal in the tuner.

14. The method of claim 11, further comprising:
generating an Intermediate Frequency (IF) signal based on the in-phase component signal and the quadrature component signal;
converting the IF signal to a National Television Standards Committee (NTSC) compatible signal; and
driving a monitor to display the converted NTSC compatible signal.

15. The method of claim 11, wherein the down-converting comprises:
dividing the RF signal into a first component signal and a second component signal, the first component signal and the second component signal having an equal phase and equal amplitude;
dividing the control signal into a third component signal and a fourth component signal, the third component signal having a phase that is shifted by 90° relative to a phase of the fourth component signal; and
mixing the first component signal and the third component signal to generate the in-phase component signal, and mixing the second component signal and the fourth component signal to generate the quadrature component signal.

16. The method of claim 11, further comprising:
periodically calibrating, based on the test frequency of the test signal, the generating of the RF signal to correct the determined imbalance.

17. The method of claim 11, further comprising:
determining, based on the test signal, an imbalance between a desired phase difference between a phase of the in-phase component signal and a phase of the quadrature component signal.

18. The method of claim 17, further comprising:
periodically calibrating, based on the test frequency of the test signal, the generating of the RF signal to correct the determined imbalance.

* * * * *